United States Patent
Tanaka et al.

(10) Patent No.: US 6,948,371 B2
(45) Date of Patent: Sep. 27, 2005

(54) ACOUSTIC WAVE TOUCH DETECTING APPARATUS

(75) Inventors: Yoshikazu Tanaka, Yokohama (JP);
Daniel Scharff, San Leandro, CA (US);
Christopher Dews, Fremont, CA (US)

(73) Assignee: ELO Touchsystems, Inc., Menlo Park, CA (US)

( * ) Notice: Subject to any disclaimer, the term of this patent is extended or adjusted under 35 U.S.C. 154(b) by 0 days.

(21) Appl. No.: 10/712,753

(22) Filed: Nov. 12, 2003

(65) Prior Publication Data

US 2005/0035685 A1 Feb. 17, 2005

(30) Foreign Application Priority Data

Nov. 13, 2002 (JP) ......................................... 2002-329478

(51) Int. Cl.[7] .............................................. G01H 11/00
(52) U.S. Cl. ........................ 73/649; 73/514.28; 345/173
(58) Field of Search ..................... 73/649, 643, 514.28; 345/173, 177; 310/313 R, 334

(56) References Cited

U.S. PATENT DOCUMENTS

| | | | | |
|---|---|---|---|---|
| 5,241,308 A | * | 8/1993 | Young .......................... | 341/34 |
| 6,091,406 A | * | 7/2000 | Kambara et al. ............ | 345/177 |
| 6,406,990 B1 | * | 6/2002 | Kawai .......................... | 438/612 |
| 6,567,077 B2 | * | 5/2003 | Inoue et al. ................. | 345/173 |
| 6,741,237 B1 | * | 5/2004 | Benard et al. ............... | 345/173 |
| 6,765,274 B2 | * | 7/2004 | Honda ......................... | 257/414 |

* cited by examiner

*Primary Examiner*—Hezron Williams
*Assistant Examiner*—Jacques M. Saint-Surin

(57) ABSTRACT

An FPC is constructed of two FPC branches, and a connection line that connects to a controller. Printed wiring of the connection line includes ten printed wires. The central four printed wires are signal reception wires, which are connected to two converters (sensors). Grounding wires are provided on both sides of the four signal reception wires. Two outer signal wires are provided adjacent to the grounding wires, respectively toward the outsides thereof. Further, two more grounding wires are provided adjacent to the outer signal wires, respectively on the outsides thereof. This construction results in shielding of all of the signal wires. This relationship is maintained in the FPC branches as well.

10 Claims, 14 Drawing Sheets

ACOUSTIC WAVE TOUCH DETECTING APPARATUS

BACKGROUND OF THE INVENTION

1. Field of the Invention

The present invention relates to an acoustic wave contact detecting apparatus, such as an ultrasonic touch panel.

2. Description of the Related Art

Ultrasonic acoustic wave contact detecting apparatuses are in widespread use. Examples of their applications include operating screens of personal computers, ticket dispensers at train stations, copiers installed in convenience stores, and ATM's at financial institutions. These acoustic wave contact detecting apparatuses utilize transducers, including piezoelectric vibrators (piezoelectric elements) provided on a substrate (touch panel) formed of glass or the like. These transducers function both as generating means for bulk waves and as sensors for detecting acoustic waves which are scattered by a finger or the like that contacts the touch panel. The transducers and controllers of control circuits are connected by wires which are insulated by insulative coverings.

However, in the case that the periphery of the substrate is covered by bezels and the like, it is difficult to arrange the wires due to the scarcity of space.

There are also cases in which flat cables, such as Flexible Printed Circuits (FPC), are employed, as disclosed in Japanese Unexamined Patent Publication No. 6 (1994)-324792 (page 5, FIG. 9). FPC's are flexible boards on which circuits are printed.

In the case that FPC's are employed for connection with a substrate, external electromagnetic waves easily enter the signal circuits (signal wires) formed on the FPC. In addition, there is a problem that electromagnetic waves radiate to the exterior from the signal wires. The reason for this is because the signal wires of the FPC's are structured such that they are substantially exposed to the exterior. In the case of the FPC's employed in Japanese Unexamined Patent Publication No. 6-324792, shield electrodes, which are larger than the FPC's, cover the FPC's to function as shield members. However, this construction adds to the cost of the apparatus, due to the necessity of separate members.

SUMMARY OF THE INVENTION

The present invention has been developed in view of the above points. It is an object of the present invention to provide an acoustic wave contact detecting apparatus, which is superior in anti-Electromagnetic Interference (EMI) properties, at low cost.

The acoustic wave contact detecting apparatus of the present invention comprises:

a substrate having a surface along which acoustic waves propagate;

an acoustic wave generating means;

a reflection array for causing the generated acoustic waves to propagate along the surface of the substrate;

a detector for detecting changes in the acoustic wave caused by an object contacting the surface of the substrate; and a controller for determining the geometric coordinates of the object; wherein:

at least one of the acoustic wave generating means and the detector are connected the controller by flexible planar wiring; and the flexible planar wiring is of a wiring pattern in which a grounding wire is provided on at least one side of a signal wire.

The flexible planar wiring may comprise:

a signal wire group in which a plurality of the signal wires are arranged; and grounding wires at both sides of the signal wire group.

The acoustic waves include ultrasonic waves that propagate through the thin substrate along the surface thereof, in addition to surface acoustic waves that propagate on the surface of the substrate.

The acoustic wave generating means may include a mode converting element and an ultrasonic vibrator. The mode converting element may be constructed by a plurality of parallel ridges formed integrally with the substrate.

The detector may be a converter. The converter may be of a type which is adhesively attached to the rear surface of the substrate. Alternatively, the converter may be a wedge type converter, which is adhesively attached to an end of a triangular prism, which is adhesively attached to the front surface of the substrate.

The flexible planar wiring includes FPC's and Flexible Flat Cables (FFC). Bifilar wires may be utilized as alternatives to the flexible planar wiring.

In the acoustic wave contact detecting apparatus of the present invention, at least one of the acoustic wave generating means and the detector are connected the controller by flexible planar wiring. The flexible planar wiring is of a wiring pattern in which a grounding wire is provided on at least one side of a signal wire. Therefore, the signal wire is electromagnetically shielded by the grounding wire, improving the anti-EMI properties of the acoustic wave contact detecting apparatus. In addition, as the necessity for an additional shielding structure is obviated, the cost of the apparatus is reduced.

Further, a construction may be adopted wherein the flexible planar wiring comprises a signal wire group in which a plurality of the signal wires are arranged; and grounding wires at both sides of the signal wire group. In this case, the group of signal wires is enabled to be collectively and efficiently shielded, further improving the anti-EMI properties. This construction also enables miniaturization of the flexible planar wiring. The miniaturization of FPC's further contribute to reduction in cost thereof, as the cost of FPC's is substantially proportional to the area thereof.

DESCRIPTION OF THE PREFERRED EMBODIMENTS

Preferred embodiments of the acoustic wave contact detecting apparatus (hereinafter, simply referred to as "apparatus") will be described with reference to the attached drawings.

Figure 1:
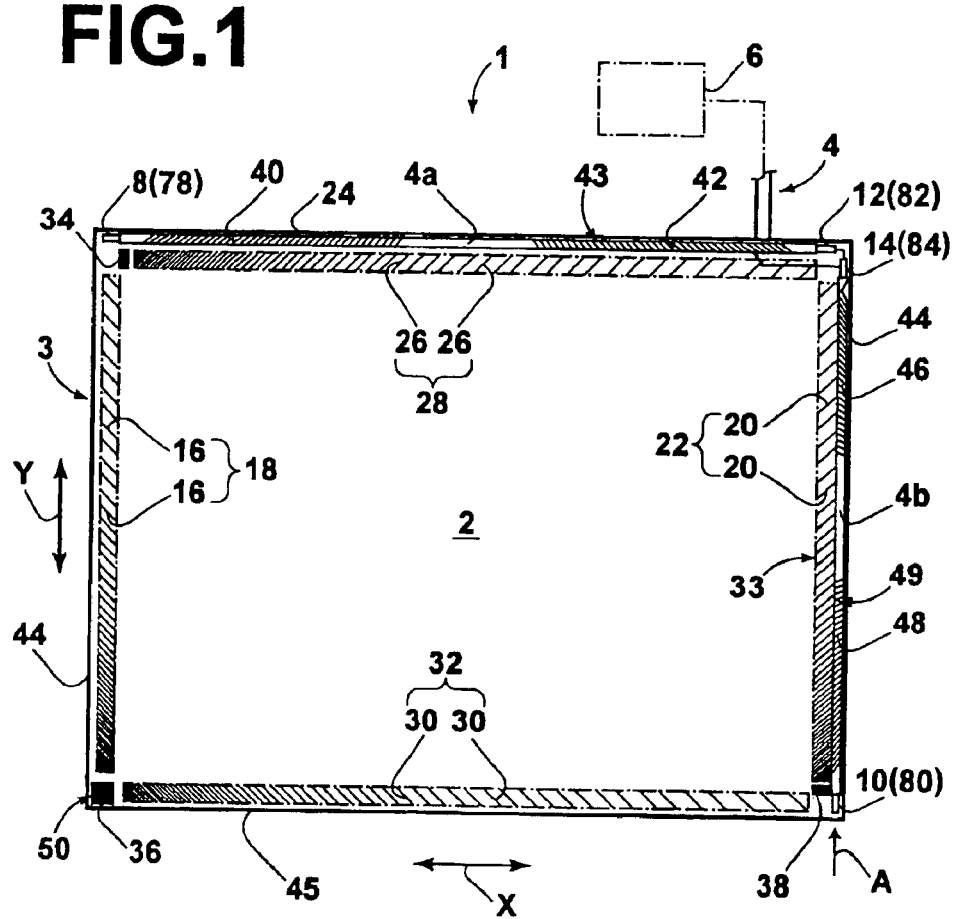
FIG. 1 is a front view of a touch panel, to be utilized in an acoustic wave contact detecting apparatus of the present invention.

FIG. 1 is a front view of a touch panel 3, to be utilized in an apparatus 1. As shown in FIG. 1, the touch panel 3 comprises: a substrate 2 formed by a rectangular glass plate; a Flexible Printed Circuit 4 (FPC) mounted on the substrate 2; and a controller 6, which is electrically linked to the FPC 4.

The FPC 4 is branched into an FPC branch 4a and an FPC branch 4b. The FPC branch 4a extends along the horizontal direction of the substrate 2, that is, the X axis direction indicated by the arrow X. The FPC branch 4b extends along the vertical direction of the substrate perpendicular to the X axis, that is, the Y axis direction indicated by the arrow Y. Converters (bulk wave generating means) 8 and 10 for generating ultrasonic waves are mounted on the FPC 4. In addition, converters (detectors) 12 and 14, which function as sensors, are mounted on the FPC 4.

A reflection array 18, comprising a great number of inclined lines 16, is formed along the Y axis on the front surface of the substrate 2, in the vicinity of one lateral edge 44 thereof. A reflection array 22, comprising a great number of inclined lines 20, is formed to face the reflection array 18, at the other lateral edge 44 of the substrate. A reflection array 28, comprising a great number of inclined lines 26, is formed along the X axis in the vicinity of the upper edge 24 of the substrate 2. A reflection array 32, comprising a great number of inclined lines 30, is formed to face the reflection array 28, in the vicinity of the lower edge 45 of the substrate. The patterns of these reflection arrays 18, 22, 28, and 32 are those disclosed in Japanese Unexamined Patent Publication Nos. 61 (1986)-239322 and 2001-14094. Note that the reflection arrays 18, 22, 28, and 32 are collectively referred to as a reflection array 33. The reflection array 33 reflects acoustic waves, and causes them to propagate along the front surface of the substrate 2.

Figure 11:
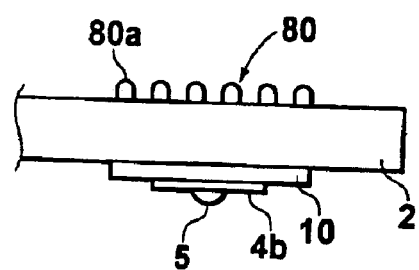
FIG. 11 is a schematic partial magnified view of the substrate of FIG. 1, viewed from the direction of arrow A.

The converters 8, 10, 12, and 14 are adhesively attached to the rear surface of the substrate 2. Mode converting elements 78, 80, 82, and 84 (grating) are formed on the front surface of the substrate 2, at positions corresponding to the converters 8, 10, 12, and 14, respectively. This construction will be described with reference to FIG. 11, taking the mode converting element 80 as an example. FIG. 11 is a schematic partially magnified view of the substrate 2, viewed from the direction of arrow A. The mode converting element 80 of FIG. 11 is formed by sintering glass paste on the substrate 2, and comprises a plurality of parallel ridges 80a. The ridges 80a shown in FIG. 11 extend in the direction perpendicular to the surface of the drawing sheet.

The widths of the ridges 80a are set to be 400 μm, and the heights are set to be 35 μm or greater. The direction in which the bulk waves are reflected is changed by varying the intervals among the ridges 80a. In the present embodiment, the ridges 80a are formed with intervals that cause surface acoustic waves to be generated directly beside the ridges 80a. The converter 10 is adhesively attached on the side of the substrate opposite the mode converting element 80, and is electrically connected to the FPC branch 4b with solder.

The other mode converting elements 78, 82, and 84 are of the same construction. Of these, the mode converting elements (acoustic wave generating means) denoted by reference numerals 78 and 80 convert bulk waves generated by the transmission side converters 8 and 10 into surface acoustic waves. The mode converting elements 82 and 84 convert the surface acoustic waves which have propagated along the front surface of the substrate 2 back into bulk waves.

The converter 10 generates ultrasonic vibrations (bulk waves) at a frequency of approximately 5.5 MHz. The ultrasonic vibrations travel through the interior of the substrate 2 from the rear surface thereof, and reach the mode converting element 80. The mode converting element 80 converts the ultrasonic vibrations to surface acoustic waves, which are propagated (reflected) perpendicular to the ridges 80a, toward the reflection array 32. The surface acoustic waves are reflected by the inwardly inclined lines 30 of the reflection array 32 and propagate along the front surface of the substrate 2 toward the reflection array 28 until they reach the inwardly inclined lines 26.

Bulk waves which are not converted to surface acoustic waves by the mode converting elements 78 and 80 are not radiated in a specific direction, but propagate in all directions from the mode converting elements 78 and 80. If a portion of the unconverted bulk waves are transmitted to the converters 12 and 14, they become spurious waves that obstruct primary signal detection. In addition, although the mode converting elements 78 and 80 are constructed to generate surface acoustic waves in a direction perpendicular to the ridges thereof, it is known that slight surface acoustic waves are generated in unintended directions. These surface acoustic waves may also become spurious waves that obstruct primary signal detection. If these spurious waves reach the converters 12 and 14, noise signals are generated thereat.

The surface acoustic waves that reach the reflection array 28 are reflected thereby to propagate toward the mode converting element 84. The surface acoustic waves that reach the mode converting element 84 are converted to bulk waves thereby. The converted bulk waves are transmitted to the converter 14 on the rear surface of the substrate 2, which senses and converts the vibrations thereof to electrical signals.

In a similar manner, the ultrasonic vibrations (bulk waves) generated by the converter 8 are converted to surface acoustic waves by the mode converting element 78. Then, the surface acoustic waves reach the mode converting element 82 via the reflection array 18 and the reflection array 22. The surface acoustic waves are converted to bulk waves by the mode converting element 82, transmitted to the converter 14, which senses and converts them to electrical signals.

In this manner, the surface acoustic waves are propagated across the entire region of the front surface of the substrate 2 covered by the reflection arrays 18, 22, 28, and 32. Therefore, if a finger (object) contacts (touches) the substrate 2 within this region, the surface acoustic waves blocked by the finger disappear or are attenuated. The signal change accompanying the change in the surface acoustic waves is transmitted from the converters 12 and 14, which function as sensors, to a timing circuit of the controller 6 connected thereto. The controller 6 determines the geometric coordinates of the position touched by the finger.

The surface acoustic waves are reflected by each of the inclined lines 16, 20, 26, and 30 of the reflection array 33. 0.5% to 1% of the surface acoustic waves that reach each of the inclined lines are reflected thereby. The remainder passes through and is transmitted to the adjacent inclined line, so that all of the inclined lines sequentially reflect the surface acoustic waves.

Spurious wave scattering means for reducing noise by diffusing spurious waves, that is, diffusion gratings, are formed on the front surface of the substrate 2 of the apparatus 1. The diffusion gratings include the rectangular portions denoted by reference numerals 34, 36, and 38 in FIG. 1, a diffusion grating 43 formed by inclined lines 40 and 42 along the upper edge 24, and a diffusion grating 49 formed by inclined lines 46 and 48 along the lateral edge 44. The inclined lines 40, 42, 46, and 48 construct a second reflection array, having a function different from that of the reflection arrays 18, 22, 28, and 32. The second reflection array is also provided within the diffusion gratings 34, 36, and 3B (refer to FIG. 7). Details of the diffusion gratings 34, 36, 38, 43, and 49 will be described later. Note that the diffusion gratings will collectively be referred to as a diffusion grating 50.

Figure 2:
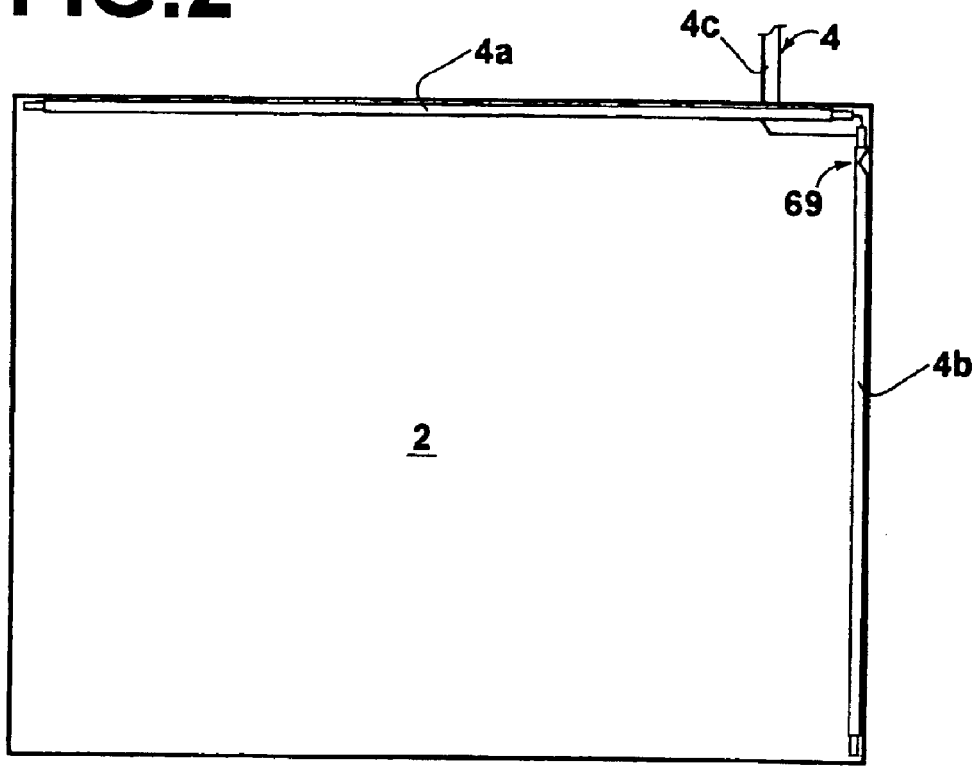
FIG. 2 is a front view illustrating an FPC which is attached to a substrate.
Figure 3:
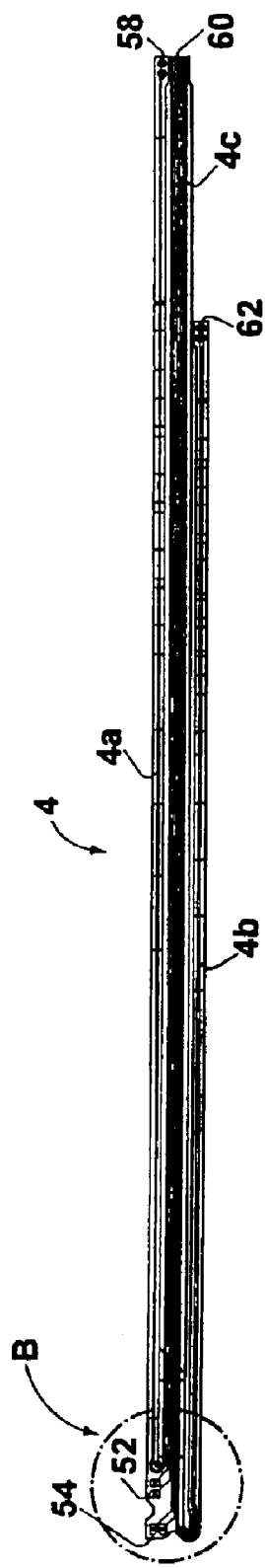
FIG. 3 is a schematic plan view showing the entirety of the FPC.
Figure 4:
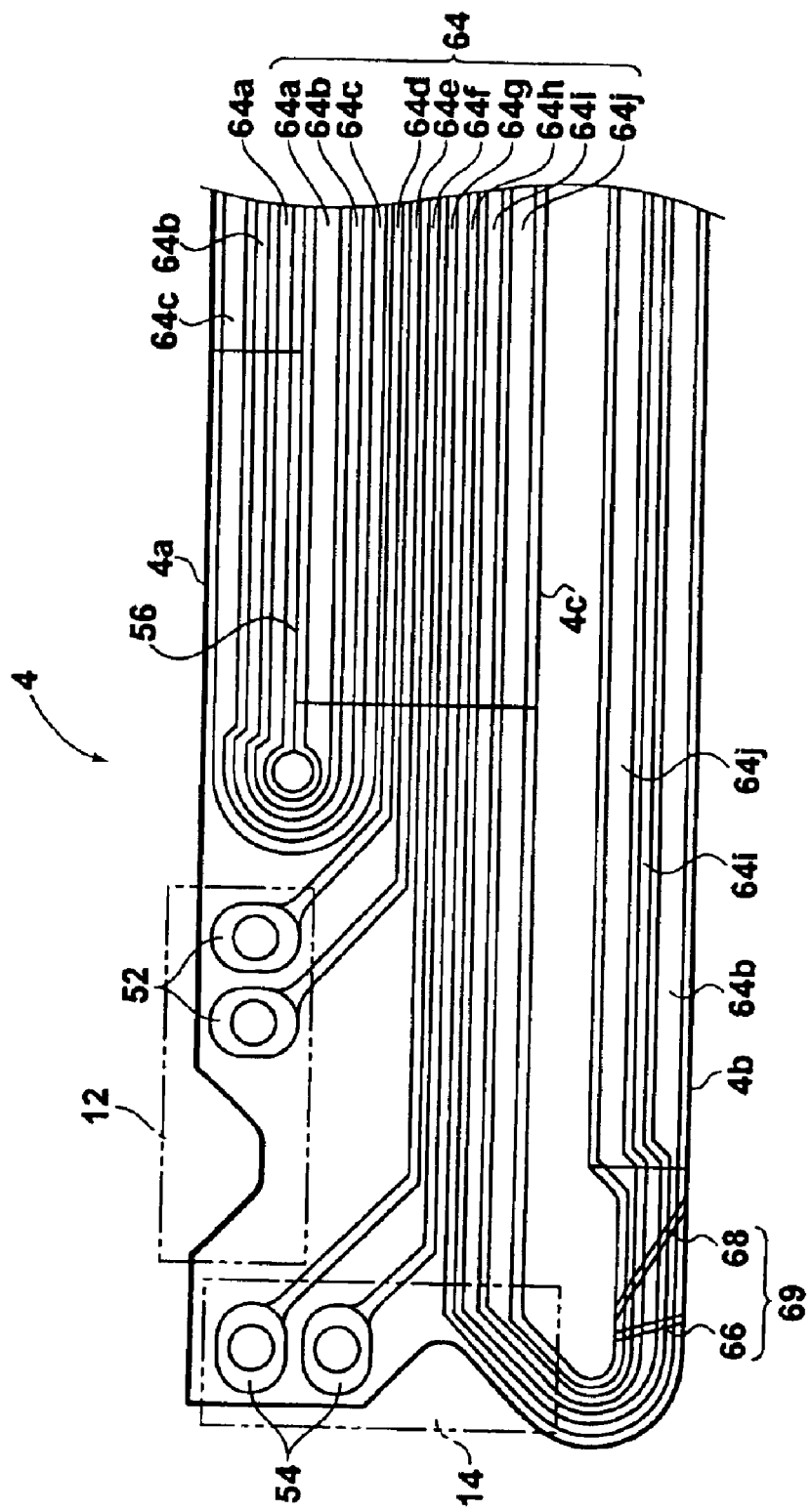
FIG. 4 is a magnified view of the portion of the FPC indicated by B in FIG. 3.

Next, the FPC 4, which is adhesively attached to the substrate 2, will be described with reference to FIG. 2, FIG. 3, and FIG. 4. FIG. 2 is a front view illustrating the FPC 4, which is attached to the substrate 2. Although the FPC 4 is adhesively attached to the rear surface of the substrate 2, it is drawn in solid lines for the sake of convenience. Note that the reflection array 33 and the diffusion grating 50 are omitted from FIG. 2. FIG. 3 is a schematic plan view showing the entirety of the FPC 4. FIG. 4 is a magnified view of the portion of the FPC 4 indicated by B in FIG. 3. The FPC 4 as shown in FIG. 3 and FIG. 4 correspond to a state in which it is viewed from the rear surface of the substrate 2 of FIG. 2.

Electrodes 52 and 54, corresponding respectively to the converters (sensors) 12 and 14, are provided at one end of the FPC 4, as shown in FIG. 3 and FIG. 4. The electrodes 52 and 54 are connected to the converters 12 and 14 from above by soldering, a conductive adhesive such as silver paste, or an anisotropic conductive adhesive. That is, the converters 12 and 14 are positioned between the FPC 4 and the rear surface of the substrate 2. The FPC 4 is constructed by the aforementioned FPC branches 4a and 4b, and a connection line 4c for connecting with the controller 6.

The connection line 4c and the FPC branch 4a are of the same length, and are formed integrally as a band (refer to FIG. 3). Perforations 56 are formed between the connection line 4c and the FPC branch 4a, to enable separation of the two. An electrode 58, for connecting with the converter 8, is formed at the end of the FPC branch 4a opposite that at which the electrode 52 is provided. An electrode 60, for connecting with the controller 6, is formed at the end of the connection line 4c near the electrode 58. An electrode 62, for connecting with the converter 10, is formed at the end of the FPC branch 4b opposite that at which the electrode 54 is provided (refer to FIG. 3).

As shown in FIG. 4, a printed wiring 64 of the connection line 4c comprises ten printed wires 64a, 64b, 64c, 64d, 64e, 64f, 64g, 64h, 64i, and 64j. A signal wire group is constructed by four printed wires (signal reception wires) 64d, 64e, 64f, and 64g, which are connected to the converters (sensors). 12 and 14. What is important here is that grounding wires 64c and 64h are provided at either side of the signal wire group.

Signal wires 64b and 64i, which are connected to the transmission converters 8 and 10, are provided adjacent to the grounding wires 64c and 64h, respectively. Further, grounding wires 64a and 64j are provided adjacent to the signal wires 64b and 64i, respectively on the outsides thereof. This construction results in shielding of all of the signal wires, by the signal reception wires 64d, 64e, 64f, and 64g being surrounded by the grounding wires 64c and 64h, and the signal transmission wires 64b and 64i being surrounded by the grounding wires 64c and 64a, and the grounding wires 64h and 64j, respectively. This relationship is maintained in the FPC branches 4a and 4b as well. By this construction, the signal wire group consisting of the printed wires 64b, 64d, 64e, 64f, 64g, and 64i are less likely to be influenced by external electromagnetic waves. At the same time, an effect that electromagnetic waves are less likely to be radiated toward the exterior is also obtained. The above construction is particularly effective in improving anti-EMI properties in the case that the FPC 4 is extended over a long distance along the substrate 2.

Note that bending lines of the FPC branch 4b are denoted by reference numerals 66 and 68 in FIG. 4. The FPC branch 4b is bent along the bending line 66 in the direction toward the surface of the drawing sheet of FIG. 4. Then, the FPC branch 4b is bent again along the bending line 68 in the direction away from the surface of the drawing sheet of FIG. 4, so that the electrode 62 (refer to FIG. 3) faces the converter 10. The bending portion is denoted by reference numeral 69 in FIG. 2. In this manner, the FPC branch 4b is arranged along the lateral edge 44 of the substrate 2. Note that the FPC 4 is fixed to the substrate 2 by an adhesive (not shown) or the like.

Figure 5:
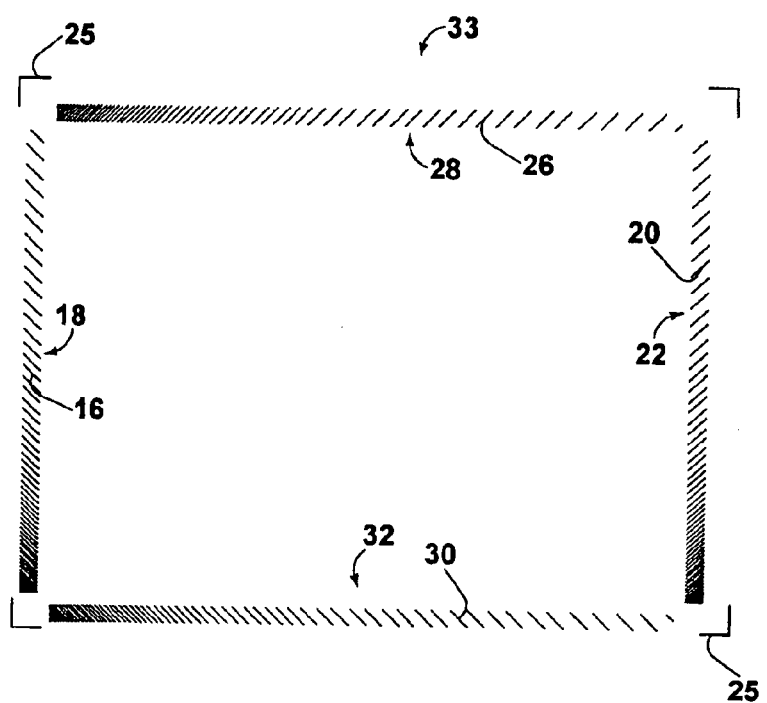
FIG. 5 is a front view of a reflection array, corresponding to that shown in FIG. 1.

Next, the arrangement of the reflection array 33 will be described with reference to FIG. 5. FIG. 5 is a front view of the reflection array 33, corresponding to that shown in FIG. 1. The diffusion gratings 34, 36, 38, and the like for scattering spurious waves are omitted from FIG. 5. Each of the inclined lines 16, 20, 26, and 30 of the reflection arrays 18, 22, 28, and 32 is inclined at an angle of 45°. The inclined lines 16, 20, 26, and 30 are configured to reflect surface acoustic waves toward the reflection array that faces them across the substrate 2. The reflection array 33 is formed by printing fine particles of lead glass formed into a paste on the front surface of the substrate 2 by screen printing or the like, then sintering at approximately 500° C. Note that the corners of the substrate 2 are partially illustrated in FIG. 5, denoted by reference numeral 25. Alternatively, a UV curable organic ink, or an organic ink having metal particles added as filler therein to improve the reflective properties thereof, may be utilized as the material of the reflection array.

The intervals among the inclined lines 16, 20, 26, and 30 decrease, that is, the incline lines are arranged at higher densities, the further they are from the transmission side converters 8 and 10. This is because the intensities of the surface acoustic waves become attenuated as they pass through the inclined lines 16, 20, 26, and 30. Therefore, it becomes necessary to adopt the above construction to compensate for the attenuation to propagate the surface acoustic waves evenly along the front surface of the substrate 2. Note that the reflection arrays 22 and 28 are provided slightly inward from the upper edge 24 and the lateral edge 44 (refer to FIG. 1) of the substrate, respectively. This is so that the inclined lines 40, 42, 46, and 48 of the diffusion grating 50, to be described later, may be provided at the outsides of the reflection arrays 22 and 28.

Figure 6:
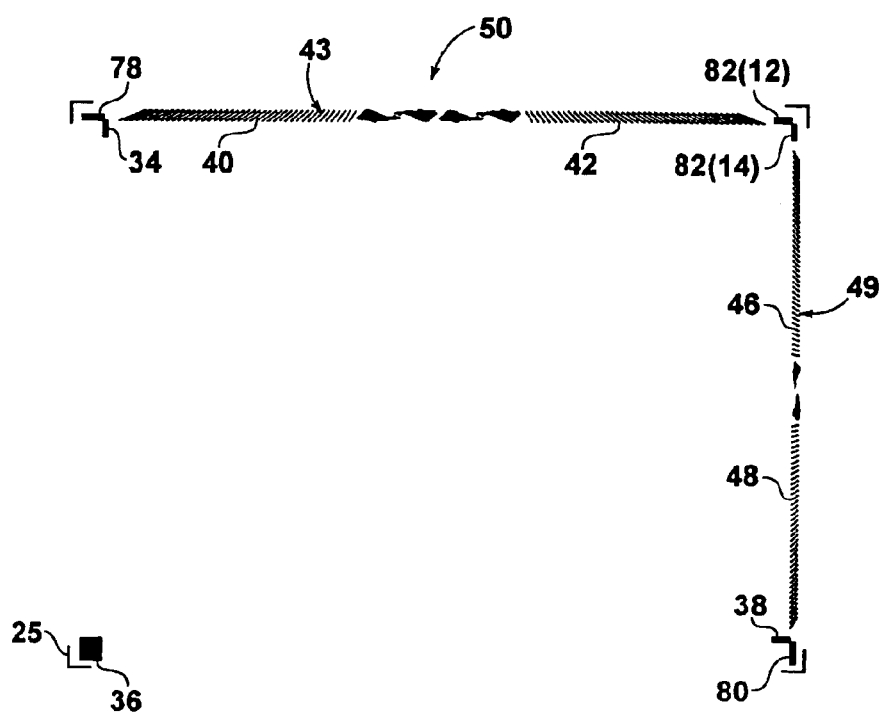
FIG. 6 is a front view of mode converting elements and a diffusion grating, corresponding to that shown in FIG. 1.

Next, the diffusion grating 50, which functions as a spurious wave scattering means, will be described with reference to FIG. 6. FIG. 6 is a front view, corresponding to FIG. 1, that shows the diffusion grating 50 along with the mode converting elements 78, 80, 82, and 84. The inclined lines 40 and 42, which constitute the second reflection array, are formed at opposite angles with respect to each other in the vicinity of the upper edge 24 of the substrate 2. The angles of the inclined lines are such that they are close to perpendicular toward the central portion of the substrate 2, and gradually decrease toward the edges thereof. In a similar manner, the other inclined lines 46 and 48, which constitute the second reflection array, are formed at opposite angles with respect to each other, with gradually changing angles. This is so that spurious waves are not reflected in the same direction, but rather are diffused.

The inclined lines 40, 42, 46, and 48 are positioned at regions where tape and the like are adhered to in conventional touch panels. That is, the inclined lines 40, 42, 46, and 48 are formed to replace the tape of conventional touch panels. The spurious waves that reach these regions are diffusively reflected by the inclined lines 40, 42, 46, and 48, so that they are not propagated to the converters (sensors) 12 and 14. The attenuation rate of ultrasonic vibration energy differs according to the frequency of the ultrasonic waves, the vibration mode, and the type of glass. The intensity of surface acoustic waves at a frequency of 5.5 MHz attenuates to 1/10 its original intensity after propagating 40 cm along a typical substrate 2 formed of soda lime glass. Accordingly, the diffusively reflected spurious waves attenuate rapidly and disappear as they are reflected across the substrate 2.

Figure 7:
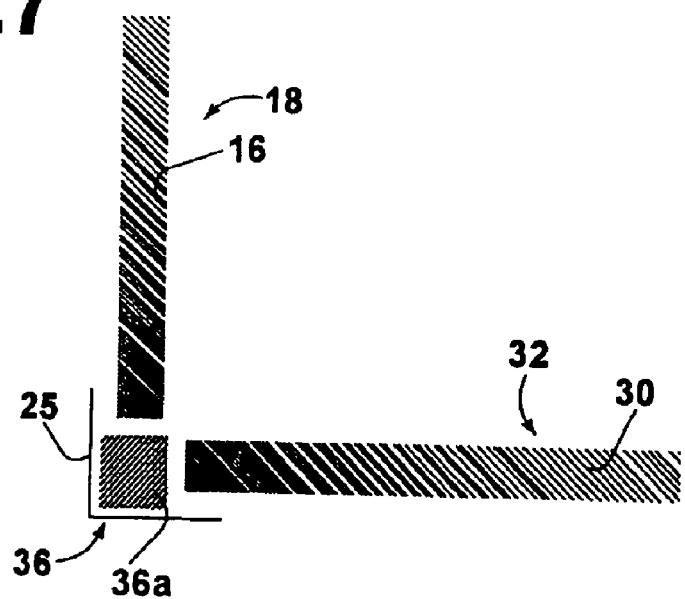
FIG. 7 is a partial magnified view of the reflection array and the diffusion grating.
Figure 8:
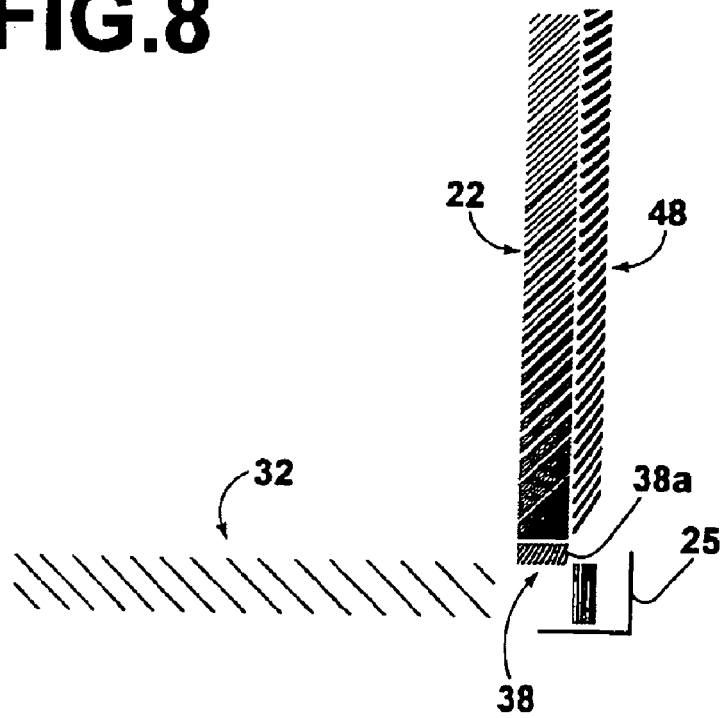
FIG. 8 is another partial magnified view of the reflection array and the diffusion grating.

A plurality of separate ridges, that is, inclined lines, inclined at angles other than 45° or −45°, are formed at the rectangular diffusion gratings 34, 36, and 38. The shapes of the ridges will be described with reference to FIG. 7 and FIG. 8. FIG. 7 is a partial magnified view of the diffusion grating 36 and the reflection array 33. FIG. 8 is a partial magnified view of the diffusion grating 38 and the reflection array 33. It is clearly shown in FIG. 7 that inclined lines 36a of the diffusion grating 36 are oriented at angles different from those of the reflection arrays 18 and 32. Likewise, FIG. 8 clearly shows the diffusion grating 38, which is constituted by steeply inclined lines 38a.

These diffusion gratings 36 and 38 also function to diffusively reflect spurious waves that propagate along the front surface of the substrate 2 toward the exterior, at angles other than 45° or −45°. The diffusion grating 34, although not illustrated in detail, possesses a similar structure and function. The inclined lines 36a and 38a may be parallel or have gradually changing angles within the respective diffusion gratings 36 and 38. The diffusion gratings 34 and 38 also function to block the paths of surface acoustic waves that propagate in directions other than a predetermined direction, so that they do not reach the converters (sensors) 12 and 14.

The diffusion grating 50 is printed on the substrate 2 by lead glass particles formed into a paste, in the same manner as the reflection array 33. Accordingly, the diffusion grating 50 may be printed at the same time that the reflection array 33 is formed. This improves productivity and reduces manufacturing costs.

Figure 9:
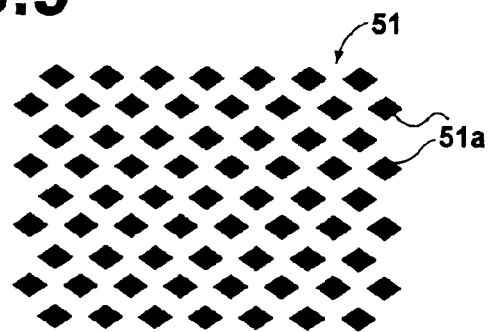
FIG. 9 is a magnified view of an alternate form of the diffusion grating.

The inclined lines 36a and 38a of the diffusion gratings 36 and 38 are formed as a plurality of ridges. However, the diffusion gratings are not limited to being formed by ridges, and various modifications are possible. An alternate construction of the diffusion grating is shown in FIG. 9. FIG. 9 is a magnified view of an alternate form of the diffusion grating. This diffusion grating 51 is constructed by a great number of protrusions 51a, which are diamond shaped in plan view. Spurious waves that reach the diffusion grating 51 are attenuated while being repetitively reflected by the protrusions 51a within the region formed thereby. The shape of the protrusions is not limited to a diamond shape, and may be any desired shape, such as rectangles, triangles, other polygonal shapes, or ovals.

Figure 10:
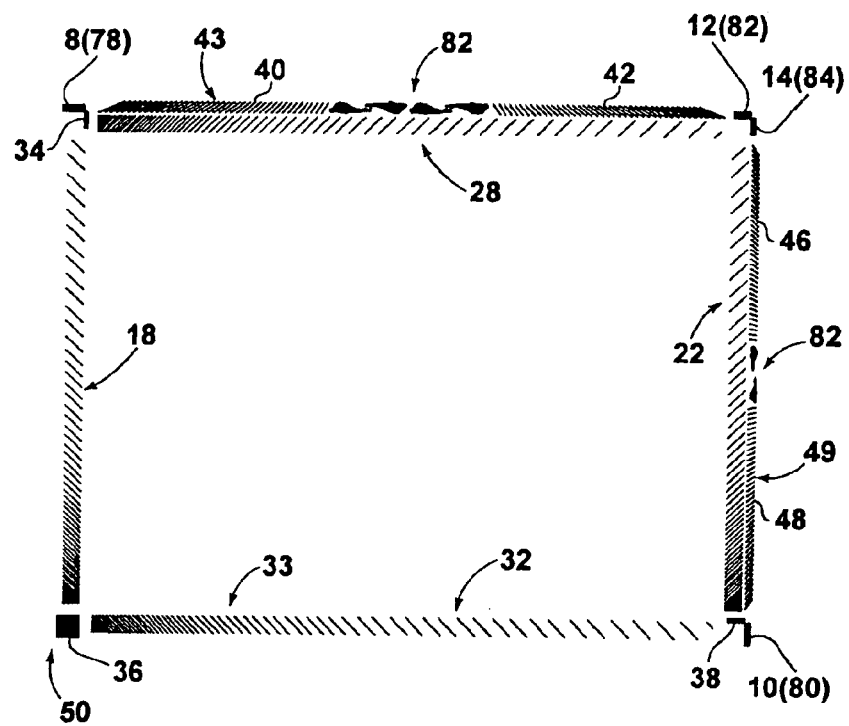
FIG. 10 is a front view illustrating the relative positions of the diffusion grating and the reflection array.

FIG. 10 is a front view illustrating the relative positions of the diffusion grating 50 and the reflection array 33, formed on the front surface of the substrate 2. FIG. 10 clearly illustrates that the inclined lines 40 and 42 are positioned outside the reflection array 28, and that the inclined lines 46 and 48 are positioned outside the reflection array 22. The diffusion gratings 34, 36, and 38 are positioned so that surface acoustic waves, which pass through the reflection array 33 without being reflected, are reflected in directions different from those in which the reflection array 33 reflects them.

More specifically, for example, surface acoustic waves generated by the converter 8 and the mode converting element 78 are reflected toward the reflection array 22 by the reflection array 18 while passing therethrough. The surface acoustic waves which are not reflected by the reflection array 18 reach the diffusion grating 36. As shown in FIG. 7, the diffusion grating 36 functions to reflect surface acoustic waves toward the outside of the substrate 2. That is, the diffusion grating 36 reflects the surface acoustic waves in the opposite direction from the primary direction, so that ultrasonic vibrations that would cause noise do not reach the converter (sensor) 12.

The inclined lines 40, 42, 46, and 48 formed along the edges of the substrate 2 are structured to diffusively reflect and attenuate bulk waves that propagate along the front surface of the substrate 2. Normally, bulk waves are converted to surface acoustic waves by the mode converting elements 78 and 80. However, bulk waves which are not 100% converted propagate in directions other than the predetermined directions therefor. Therefore, the inclined lines 40, 42, 46, and 48 are utilized to attenuate these spurious bulk waves.

In addition, surface acoustic waves propagate in directions other than the predetermined directions therefor after being converted by the mode converting elements 78 and 80. The inclined lines 40, 42, 46, and 48 also diffusively reflect these stray surface acoustic waves so that they are scattered in various directions. The risk that spurious ultrasonic vibrations reach the converters (sensors) 12 and 14 to cause noise is reduced by this diffusive reflection.

Pictures 82 of dolphins are printed between the inclined lines 40 and 42, and also between the inclined lines 46 and 48 in FIG. 10. The pictures 82 are also effective in reducing noise. The pictures 82 have curved outlines. Bulk waves or stray surface acoustic waves that reach the outlines of the pictures 82 are reflected in various directions and attenuated. Any picture may be employed as long as the outline thereof is formed of curved lines, or are of angles that cause spurious waves to be diffusively reflected in various directions. Alternatively, patterns may be printed on the substrate 2 at these portions.

Figure 12:
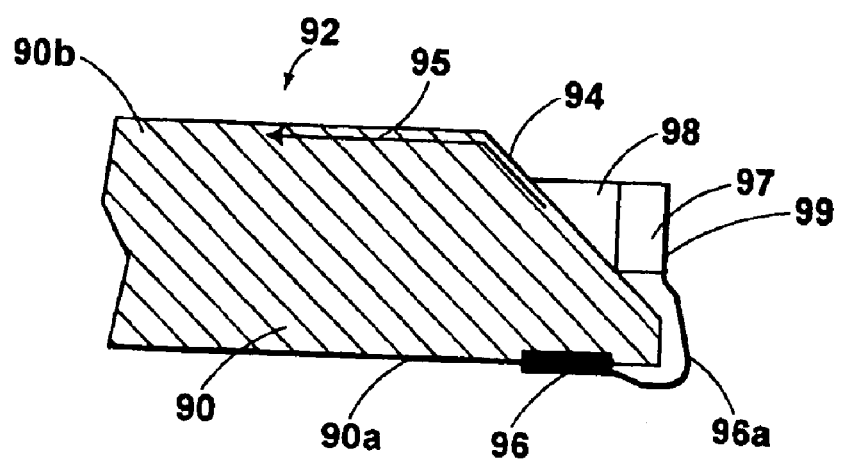
FIG. 12 is a partial magnified sectional view illustrating a second embodiment of the touch panel, in which an inclined surface is formed at the edge of the substrate, and a converter is mounted on the inclined surface.

Next, a second embodiment of the apparatus of the present invention will be described with reference to FIG. 12. FIG. 12 is a partial magnified view of a touch panel in which an inclined surface is formed at the edge of a glass substrate, and a converter is mounted on the inclined surface. An upwardly facing inclined surface 94 is formed along the entire lengths of the edges of a substrate 90 of a touch panel 92 of this second embodiment, corresponding to the upper edge 24 and the lateral edge 44 of the previous embodiment. A converter 98 which is triangular in cross section (wedge type converter) is adhesively attached to the inclined surface 94. An FPC 96 is adhesively attached to the rear surface 90a of the substrate 90. A portion 96a of the FPC 96 extends outward and is connected to the converter 98 via an electrode 99. Note that in FIG. 12, reference numeral 97 denotes a piezoelectric element which is a part of the converter 98. The converter 98 may be a transmission converter or a reception converter. In addition, the FPC 96 may alternatively be provided on the inclined surface 94.

In the touch panel 92 of this second embodiment, in the case that the converter 98 is a transmission converter, ultrasonic vibrations generated thereby are propagated upward along the inclined surface 94, then along the front surface 90b of the substrate 90, as indicated by arrow 95. Acoustic waves that propagate along the front surface 90b are changed by contact with a finger or a like. The change is detected and the touched position is determined in the same manner as in the previous embodiment. In the embodiment illustrated in FIG. 12, the converter 98 is provided on the inclined surface 94 of the substrate 90. Therefore, the converter 98 does not protrude from the substrate 90, and is easily accommodated within bezels, even if the periphery of the substrate 90 is covered with bezels or the like.

Figure 13:
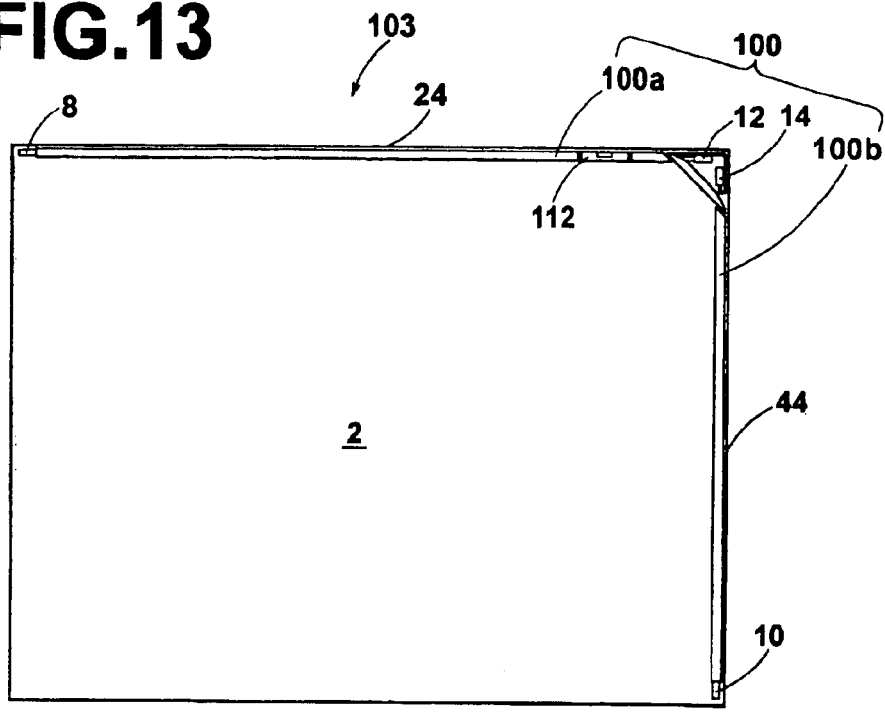
FIG. 13 is a front view of an FFC which is attached to the substrate.
Figure 14:
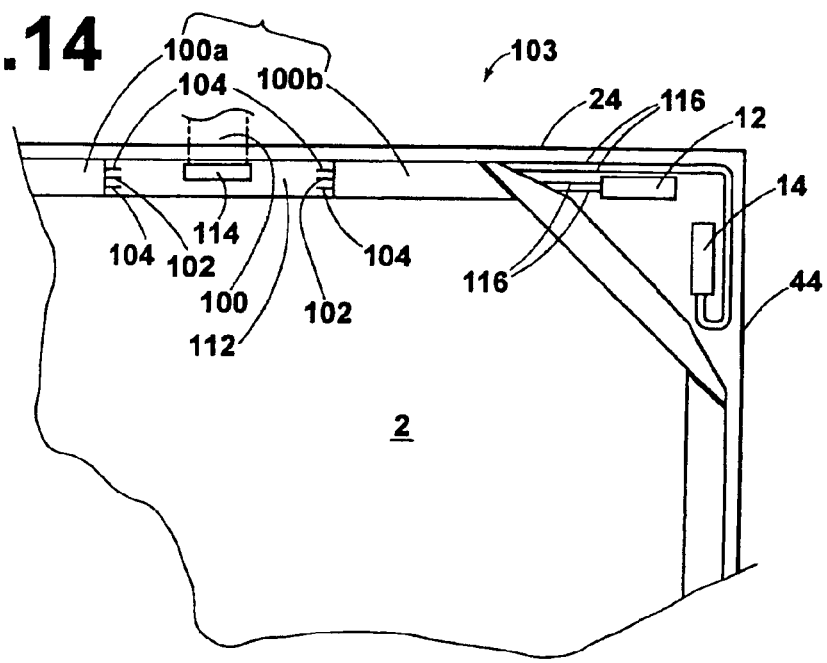
FIG. 14 is a partial magnified view of the FFC of FIG. 13.
Figure 15:
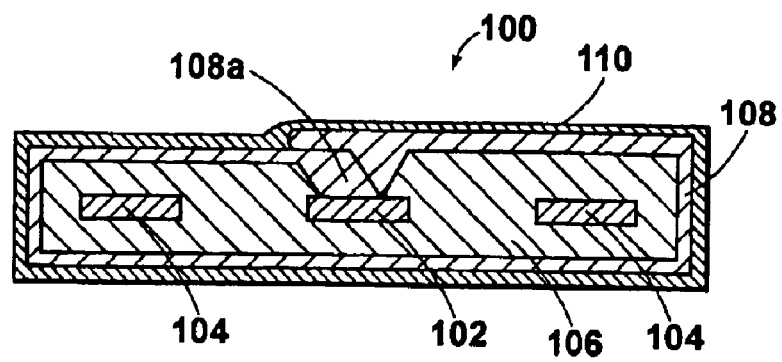
FIG. 15 is a schematic magnified sectional view of the FFC.

Next, the third embodiment of the apparatus of the present invention will be described with reference to FIG. 13 through FIG. 15. The third embodiment of the apparatus employs a flexible flat cable (hereinafter, referred to simply as "FFC") on a touch panel 103 thereof. Note that parts which are common to those of the first embodiment are denoted with the same reference numerals. FIG. 13 is a front view of an FFC 100 which is attached to the substrate 2. FIG. 14 is a partial magnified view of the FFC 100 of FIG. 13. FIG. 15 is a schematic magnified sectional view of the FFC 100. As shown in FIG. 15, the FFC 100 comprises three flat linear conductors. The three flat linear conductors are two substantially parallel signal wires 104 and 104, and a grounding wire 102 provided between the two signal wires 104, substantially parallel thereto. The signal wires 104 and the grounding wire 102 are covered by a flat insulator 106, thereby insulated from each other. By this construction, the signal wires 104 are shielded by the grounding wire 102.

The outer periphery of the insulator 106 is covered by a conductive film 108 such as copper plating, which is electrically connected to the grounding wire 102 via a connection portion 108a. By this construction, the two signal wires 104 are shielded by the film 108 in addition to the grounding wire 102, further improving the anti-EMI properties. The film 108 is covered and protected by an insulative outer covering 110.

Two FFC's 100 constructed in this manner are utilized on the substrate 2, as shown in FIG. 13 and FIG. 14. That is, an FFC 100a is provided at the upper edge 24 of the substrate 2, and an FFC 100b is provided at the lateral edge 44. The FFC 100a and the FFC 100b are connected via a rigid circuit board 112. An electrical connector 114 is mounted on the rigid circuit board 112. The electrical connector 114 functions to establish an electrical connection with the controller 6, via an FFC 100 partially shown by broken lines. The direction of the FFC 100b is changed by being folded from the lateral edge 44 toward the upper edge 24. The converters 12 and 14 are connected to the rigid circuit board 112 via conductors 116 and 116. The converters 8 and 10 are electrically connected to the distal ends of the FFC's 100a and 10b, respectively, by soldering. The FFC 100, the converters 8, 10, 12, and 14, as well as the rigid circuit board 112 are adhesively attached to the substrate 2. Note that the rigid circuit board 112 may be replaced by an FPC. The wiring for connecting the electrical connector 114 and the connector 6 is not limited to the FFC 100. An FPC, a bifilar wire (to be described later), or an FFC, from which the conductive film 108 and the insulative outer covering 110 shown in FIG. 15 are removed, that is, an FFC comprising the grounding wire 102, the signal wires 104, and the insulator 106, may alternatively be employed.

Figure 16:
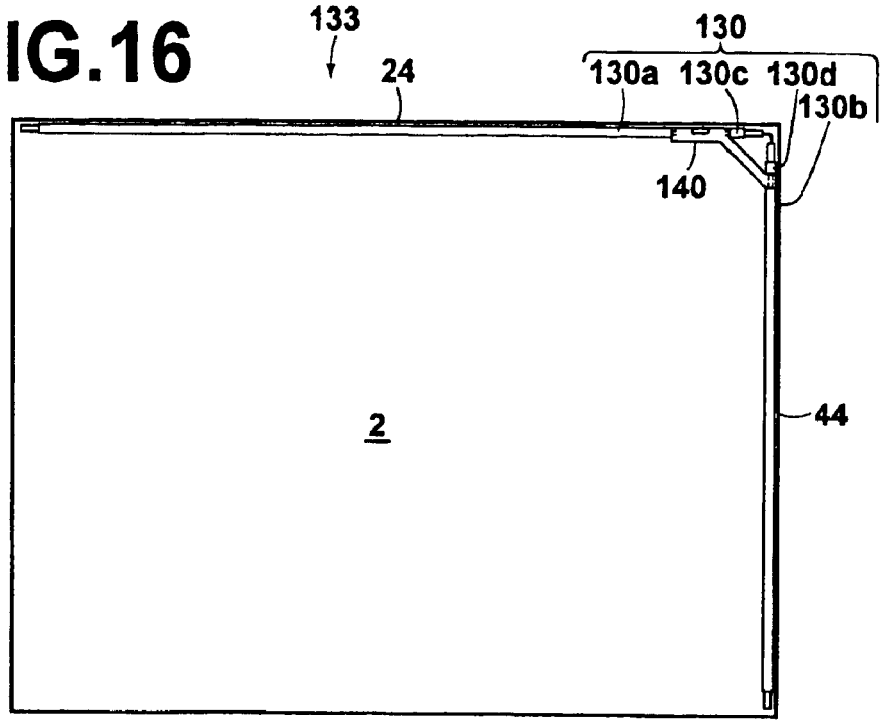
FIG. 16 is a front view of FFC which is attached to the substrate.
Figure 17:
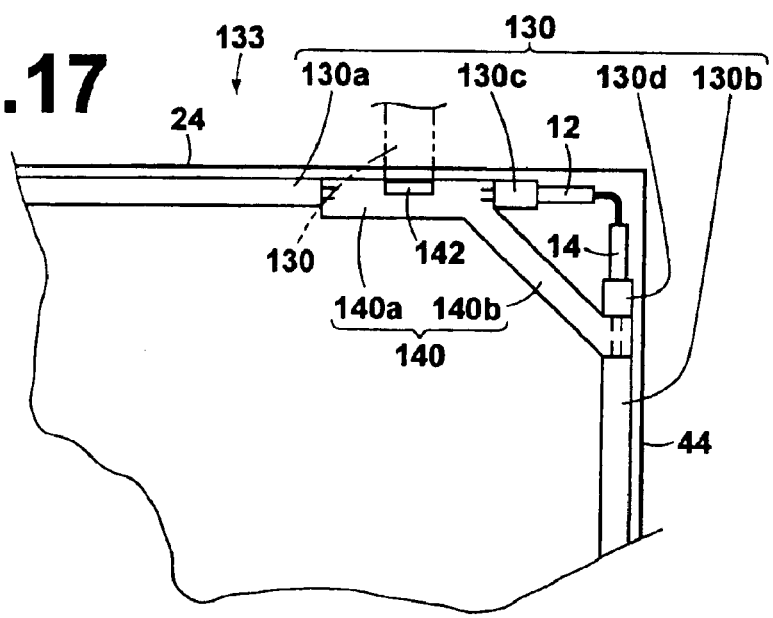
FIG. 17 is a partial magnified view of the FFC of FIG. 16.
Figure 18:
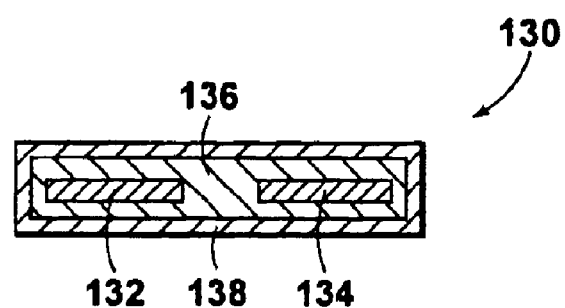
FIG. 18 is a schematic magnified sectional view of the FFC of FIG. 16.

Next, a fourth embodiment of the apparatus of the present invention will be described with reference to FIG. 16 through FIG. 18. A touch panel 133 of the fourth embodiment utilizes an alternate form of an FFC. FIG. 16 through FIG. 18 correspond to FIG. 13 through FIG. 15, respectively. FIG. 16 is a front view of an FFC 130 which is attached to the substrate. FIG. 17 is a partial magnified view of the FFC 130 of FIG. 16. FIG. 18 is a schematic magnified sectional view of the FFC 130 of FIG. 16. As shown in FIG. 18, the FFC 130 comprises two flat conductors. The two flat conductors are a signal wire 132 and a grounding wire 134, arranged parallel to each other. The periphery of the signal wire 132 and the grounding wire 134 is covered by an insulator 136. The insulator 136 is further covered by an outer covering 138, although this outer covering 138 is not always necessary. In this embodiment, the film 108 of the previous embodiment illustrated in FIG. 13 through FIG. 15 has been omitted. However, the signal wire 132 is in a state in which it is shielded by the grounding wire 134.

The FFC 130 comprises an FFC 130a, which is adhesively attached at the upper edge 24 of the substrate 2, and an FFC 130b, which is adhesively attached at the lateral edge 44. The FFC 130a and the FFC 130b are electrically connected via a rigid circuit board 140. The rigid circuit board 140 comprises a main body 140a along the upper edge 24, and an arm portion 140b that extends toward the lateral edge 44. The FFC 130a is connected to the main body 140a by soldering. The FFC 130b is connected to the arm portion 140b. The converters 12 and 14 are electrically connected to the rigid circuit board 140 via an FFC 130c and an FFC 130d, respectively. A connector 142, for connecting the rigid circuit board 140 with the controller 6 via an FFC 130, is mounted on the rigid circuit board 140. Note that the FFC 130 is only partly shown by broken lines in FIG. 17, and the controller 6 is omitted. Note that the rigid circuit board 140 may be replaced by an FPC. The wiring for connecting the electrical connector 142 to the controller 6 may be an FPC or a bifilar wire, as alternatives to the FFC 130.

In the third and fourth embodiments illustrated in FIG. 13 through FIG. 18, only small pieces of the rigid circuit boards 112 and 140, or the FPC, are necessary. Therefore, stocking of materials is facilitated, improving availability and reducing the cost. Accordingly, combined with the effect of employing inexpensive FFC's for the lengthy portions of the wiring, the cost of the apparatuses according to the third and fourth embodiments can be reduced as a whole. In the case that the rigid circuit boards 112 and 140 are employed, separate conductors such as the FFC 130 are required to connect the converters 8, 10, 12, and 14 thereto. However, in the case that the rigid circuit boards 112 and 140 are replaced by FPC's, the converters 8, 10, 12, and 14 may be directly soldered thereon.

Wires having extremely small cross sectional areas such as that of AWG 40 (diameter of about 0.5 mm), that is, bifilar wires, may be utilized in place of the FFC's 100 and 130. The bifilar wires are single wires that comprise a pair of twisted or parallel conductors, insulated from each other. As the diameters thereof are extremely small, the bifilar wires do not protrude significantly even if they are provided on the surface of the substrate 2. The pair of conductors of the bifilar wires comprises a signal wire and a grounding wire adjacent to each other. Thereby, a shielding effect is obtained by this structure.

The embodiments of the present invention have been described in detail above. However, the present invention is not limited to the embodiments described above. For example, the diffusion grating 50 may be formed by etching with hydrofluoric acid. The diffusion grating 50 may also be formed by a chemical or physical removal process employing lasers, sandblasting, or cutting. In other words, the diffusion grating 50 may be formed by grooves instead of protrusions.

In the first, third, and fourth embodiments described above, the case in which surface acoustic wave generating means of the so-called "grating type", which have mode converting elements 78, 80, 82, and 84, are employed has been described. However, the present invention is not limited to apparatuses that employ this type of surface acoustic wave generating means. For example, the present invention may be applied to an acoustic wave contact detecting apparatus that generates surface acoustic waves by means of a wedge type converter as shown in FIG. 12 that utilizes an acrylic prism. The present invention may also be applied to an acoustic wave contact detecting apparatus that employs a pair of comb electrodes formed on an ultrasonic vibrator, without a grating nor a wedge. In this case, ultrasonic vibrations are transmitted in the edge direction of the ultrasonic vibrator and not in the thickness direction thereof. Therefore, the ultrasonic vibrator can be provided on the same surface as the mode converting elements 78, 80, 82, and 84.

The FPC 4 which is utilized in the present invention may be adhesively attached to the substrate 2 with any desired adhesive. However, it is preferable that piezoelectric vibrators be adhesively attached using ultraviolet cured adhesive. This is to enable adjustment of the positions of the converters 8, 10, 12, and 14 with respect to the mode converting elements 78, 80, 82 and 84 to confirm optimal generation of surface acoustic waves prior to irradiation of ultraviolet rays, which causes adhesion.

The spurious wave scattering means may be of the type that causes diffusive reflection and attenuation, as described above. Note that the two converters (sensors) 12 and 14 are provided in close proximity to each other in the embodiments described above. However, the converters (sensors) 12 and 14 may switch places with the transmission converters 8 and 10, so that they are positioned apart from each other. In this case, when surface acoustic waves leak from either the converter 12 or 14, as the other converter 14 or 12 is not in close proximity therewith, the noise picked up by the other converter is suppressed. In addition, the electrical path from the controller 6 to the transmission converters 8 and 10 can be reduced. Therefore, spurious radiation, that is, emission of electromagnetic waves, from the electrical path, can be suppressed.

What is claimed is:

1. An acoustic wave contact detecting apparatus comprising:

a substrate having a surface along which acoustic waves propagate;

an acoustic wave generating means;

a reflection array for causing the generated acoustic waves to propagate along the surface of the substrate;

a detector for detecting changes in the acoustic wave caused by an object contacting the surface of the substrate; and a controller for determining the geometric coordinates of the object; wherein:

at least one of the acoustic wave generating means and the detector are connected to the controller by flexible planar wiring; and the flexible planar wiring is of a wiring pattern in which a grounding wire is provided on at least one side of a signal wire.

2. An acoustic wave contact detecting apparatus as defined in claim 1, wherein:

the flexible planar wiring comprises:

a signal wire group in which a plurality of the signal wires are arranged; and grounding wires at both sides of the signal wire group.

3. An acoustic wave contact detecting apparatus comprising:

a substrate having a surface along which acoustic waves propagate;

a transmission side converter mounted on the substrate;

a mode converting element for converting bulk waves generated by the converter into acoustic waves, mounted on the surface of the substrate corresponding to the converter;

a reflection array for causing the generated acoustic waves to propagate along the surface of the substrate;

a detector for detecting changes in the acoustic wave caused by an object contacting the surface of the substrate; and a controller for determining the geometric coordinates of the object; wherein:

at least one of the converter and the detector are connected to the controller by flexible planar wiring; and the flexible planar wiring is of a wiring pattern in which a grounding wire is provided on at least one side of a signal wire.

4. An acoustic wave contact detecting apparatus comprising:

a substrate having a surface along which acoustic waves propagate;

a transmission side converter mounted on the substrate;

a mode converting element for converting bulk waves generated by the converter into acoustic waves, mounted on the surface of the substrate corresponding to the converter;

a reflection array for causing the generated acoustic waves to propagate along the surface of the substrate;

a detector for detecting changes in the acoustic wave caused by an object contacting the surface of the substrate; and a controller for determining the geometric coordinates of the object; wherein:

at least one of the converter and the detector are connected to the controller by a bifilar wire; and the bifilar wire is that in which a grounding wire is provided adjacent to a signal wire.

5. An acoustic wave contact detecting apparatus as defined in claim 3, wherein:

the substrate further comprises an inclined surface at an edge thereof; and the converter is mounted on the inclined surface.

6. An acoustic wave contact detecting apparatus as defined in claim 4, wherein:

the substrate further comprises an inclined surface at an edge thereof; and the converter is mounted on the inclined surface.

7. An acoustic wave contact detecting apparatus as defined in claim 3, wherein:

the flexible planar wiring is a flexible printed circuit (FPC).

8. An acoustic wave contact detecting apparatus as defined in claim 5, wherein:

the flexible planar wiring is a flexible printed circuit (FPC).

9. An acoustic wave contact detecting apparatus as defined in claim 3, wherein:

the flexible planar wiring is a flexible flat cable (FFC).

10. An acoustic wave contact detecting apparatus as defined in claim 3, wherein:

the flexible planar wiring is a flexible flat cable (FFC).

* * * * *